United States Patent [19]

Hofer et al.

[11] 4,081,742

[45] Mar. 28, 1978

[54] QUANTITATIVE ANALYSIS OF NUCLEAR MAGNETIC RESONANCE SPECTRA HAVING SOLVENT PEAKS

[75] Inventors: Donald C. Hofer; Vincent N. Kahwaty, both of Poughkeepsie; Carl R. Valentino, Hopewell Junction, all of N.Y.

[73] Assignee: International Business Machines Corporation, Armonk, N.Y.

[21] Appl. No.: 755,271

[22] Filed: Dec. 29, 1976

[51] Int. Cl.$^2$ ............................................. G01R 33/00
[52] U.S. Cl. ............................... 324/.5 A; 324/.5 AC; 324/.5 R
[58] Field of Search ................ 324/.5 R, .5 A, .5 AC, 324/77 B

[56] References Cited

U.S. PATENT DOCUMENTS

| | | | |
|---|---|---|---|
| 3,674,998 | 7/1972 | Benz | 324/.5 AC |
| 3,781,650 | 12/1973 | Keller | 324/.5 A |
| 3,873,909 | 3/1975 | Ernst | 324/.5 A |
| 3,968,424 | 7/1976 | Ernst | 324/.5 A |

*Primary Examiner*—M. Tokar
*Attorney, Agent, or Firm*—D. R. McKechnie

[57] ABSTRACT

A method is described for the quantitative analysis of a solution in which the solvent produces a nuclear magnetic resonant (NMR) spectral peak that dominates the system. A first spectrum containing the peak is made by operation of a nuclear magnetic resonant spectrometer at a first gain setting. The NMR apparatus is a pulse-modulated, Fourier-transform type spectrometer. A second spectrum is produced in which a 180° pulse is applied to invert the spectral component magnetization followed after a period of time by a 90° pulse. The period of time is sufficient to allow the solvent or component producing the unwanted peak to relax from the inverted state to a point where there is minimum magnetization along the longitudinal axis. At this point, in many solutions the other components have completely relaxed so that the 90° pulse produces a free induction decay signal which, after undergoing the Fourier-transformation, yields a spectrum that does not include any significant peak due to the solvent. Thereafter, the quantitative analysis is performed by measuring the areas under the respective component peaks and simultaneously solving a series of equations in which the weight of the various components is proportional to the respective areas under the peaks and to the gain settings of the spectrometer.

5 Claims, 6 Drawing Figures

FIG. 5
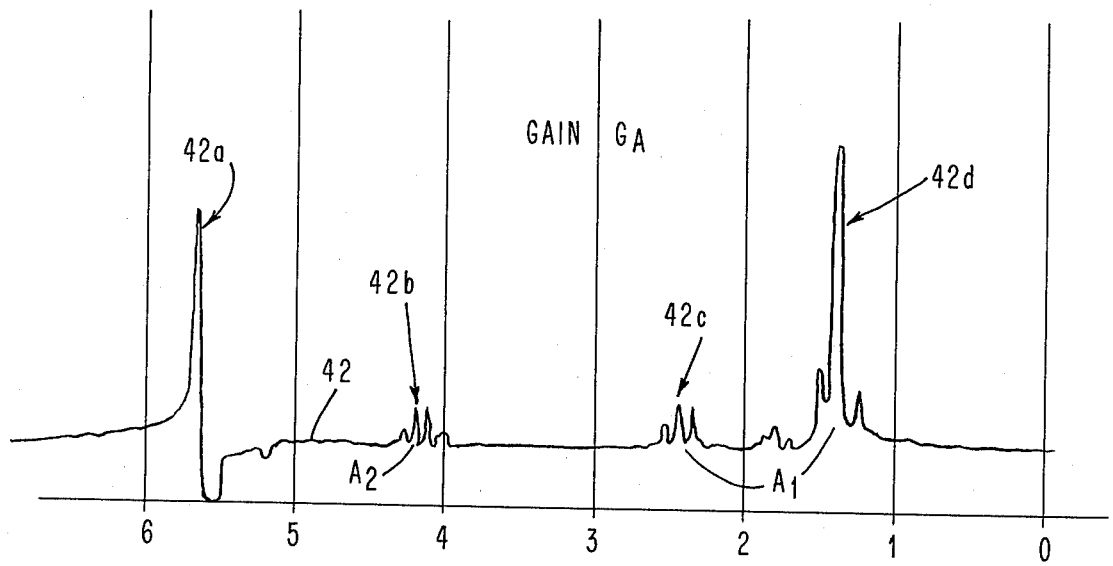
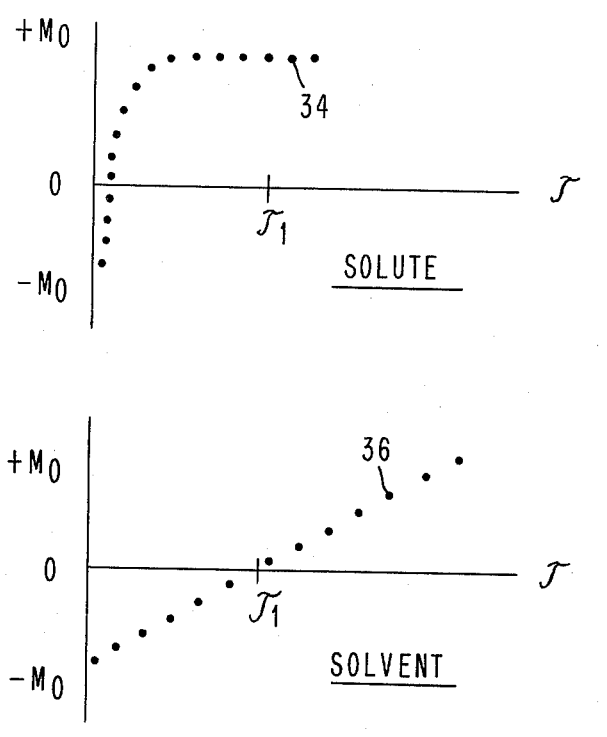
FIG. 6

QUANTITATIVE ANALYSIS OF NUCLEAR MAGNETIC RESONANCE SPECTRA HAVING SOLVENT PEAKS

BACKGROUND OF THE INVENTION

1. Field of the Invention

This invention relates to the field of nuclear magnetic resonance (NMR) spectroscopy and, more particularly, to a method for analyzing the composition of a solution using an inversion recovery Fourier transform (FT) technique.

2. Prior Art

Pulse-actuated FT NMR spectrometers are well known in the prior art. Such instruments conventionally include a holder for positioning a sample to be analyzed in a strong homogenous unidirectional magnetic field. An intense pulse of radio frequency (RF) energy is applied to the sample for a short period of time, the pulse being a mixture of different frequencies operative to excite different resonant groups with the sample and produce a free induction decay (FID) signal. Several FID signal measurements are commonly made to time average data points and improve the signal-to-noise (S/N) ratio. The FID signal is an analog one and it is commonly digitized so that a conventional digital computer can be used to perform a fast FT to produce a frequency domain spectrum of the FID signals. The spectrum can be used for both a quantitative and qualitative analysis of the sample.

One of the difficulties in the use of NMR spectrometers arises when attempting to analyze a sample consisting of a solution containing organic compounds dissolved in a solvent containing nuclei of the type excited by the RF pulse. This commonly occurs in the proton analysis of compound mixture dissolved in water where the hydrogen nuclei or protons of the water are more abundant and produce a much stronger spectral line than that produced by the compounds of interest. In other words, in the spectrum, the peak due to the solvent is much higher, often by a factor of from ten-to-one to one-hundred-to-one or more, than the peak or peaks of the solute. The smaller solute peaks are then more difficult to analyze. Additionally the solvent peak may overlap or hide a solute peak of interest.

To avoid the above difficulty, an inversion recovery technique may be used. This technique is known and is described in the article "Measurement of Spin Relaxation in Complex Systems," by R. L. Vold et al, J. Chem Phys. Vol. 48 (1968), pages 3831–3832. In accordance with this technique, a series of pulse sequences of 180° and 90° pulses are applied with variable times between the pulses, to obtain a spectra of the magnetization vector Mz along the Z-axis for each component of the spectrum. One of the spectra thus produced includes the condition that the magnetization of the solvent peak is substantially zero and therefore the solvent peak is eliminated from the spectrum. Thus, the remaining peaks are those of only the compounds undergoing analysis. To our knowledge, the use of such technique in the prior art has been limited to providing a qualitative analysis of the compounds and the technique has not been used in connection with a quantitative analysis particularly in the manner of our invention, as discussed in detail below.

Various quantitative analytical NMR techniques are known in the prior art including one in which a spectrum is analyzed by dividing the spectrum into regions containing the various peaks, the number of regions being equal to or greater than the number of compounds in the mixture under analysis. The areas under the peaks in such regions are determined and then the concentrations of the compounds are calculated in accordance with a set of linear equations defined by:

$$A_i = \sum_{j=1}^{N} a_{ij} f_j \quad (1)$$

where $A_i$ = area of spectral region $i$ $a_{ij}$ = area of spectral region produced by a concentration of 1 gram per ml. of compound $j$ $f_j$ = concentration of compound $j$ (g/ml), i.e., the fraction of 1 g/ml which the concentration of compound $j$ represents in the mixture.

N = number of compounds

Equation (1) may be written in matrix form as:

$$A = a F \quad (2)$$

$$f = a^{-1} A \quad (3)$$

Equation (3) represents the matrix solution. For an example, where there are two compounds in the mixture, the explicit solutions are:

$$f_1 = \frac{a_{22} A_1 - a_{12} A_2}{a_{22} a_{11} - a_{12} a_{21}} \quad (4)$$

$$f_2 = \frac{a_{21} A_1 - a_{11} A_2}{a_{21} a_{12} - a_{11} a_{22}} \quad (5)$$

This general technique is described in "High Resolution NMR," by E. Becker, Chapter 12, 1969, Academic Press, New York, and in references cited therein. To our knowledge, such quantitative analysis has not been used in conjunction with the inversion recovery technique probably because quantitative analytical capabilities have not been introduced on commercial systems.

SUMMARY OF THE INVENTION

One of the objects of the invention is to provide a method for making an accurate quantitative analysis of a solution in which the solvent produces a strong NMR spectral peak which may dominate, hide or be close to a solute peak, which method involves the use of an NMR spectrometer having a variable gain feature and the capability of conducting experiments with variable pulse sequences.

Another object is to provide an NMR quantitative analytical technique using a pulse modulated Fourier transform spectrometer to perform an inversion recovery experiment so as to produce a spectrum having a minimized solvent peak.

Another object is to provide an NMR analytical technique in which the areas under any solute peaks can be accurately measured by producing a spectrum at a relatively high gain setting of an NMR spectrometer.

Still another object is to provide an NMR analytical technique in which an inversion recovery Fourier transform NMR experiment can be used to produce a quantitative analysis of the components of a solution.

Briefly, the manner in which these and other objects of the invention are achieved is to first produce a frequency domain spectrum of the solution in which spectrum the solvent peak produces a maximum intensity at the given gain setting which will not saturate the detection system of the spectrometer and wherein the solvent peak may hide or be spaced relatively close to one or more solute peaks and wherein the relative intensities of the solute peaks are small compared to that of the solvent peaks. Next, a second spectrum is obtained by exciting the sample with a 180° pulse followed after a given period of time by a 90° pulse, the period of time being chosen so that the solvent has not completely relaxed while the solute components have relaxed so that the resultant spectrum does not include any significant peaks due to the solvent. Such measurement can be made at increased gain settings on the spectrometer to increase the areas and hence increase the accuracy of making measurements of the relative areas. Next, the relative areas under the different component peaks are measured or determined. Lastly, the percentage weight composition is calculated by the simultaneous solution of equations in which the relative weight percentages are proportional to the component areas of the curves and to the gain settings of the spectrometer.

Other objects and advantages of the invention will be apparent from the following description taken in connection with the accompanying drawing wherein:

FIG. 5 is an NMR spectrum produced in accordance with the inversion recovery technique of the invention; and FIG. 6 illustrates two exemplary graphs useful in understanding the relaxation times used in the inversion recovery step of the invention.

As previously indicated, the invention is a process for quantitatively analyzing certain solutions that lend themselves to such analysis, the process involving the operation of an NMR spectrometer and the subsequent analysis of data produced thereby. Preferrably, the spectrometer is a pulsed Fourier transform (FT) type having a variable gain for adjusting the dynamic range of the receiver and having the capability of providing different pulse sequences including a 90° pulse and a 180°-$\tau$-90° pulse sequence with variable settings for the time $\tau$. A suitable spectrometer is the commercially available model WH 90 FT NMR spectrometer available from Bruker Corp. To carry out the method of the invention, it should be obvious to those skilled in the art of NMR spectroscopy that other models of NMR spectrometers may be used.

Figure 1:
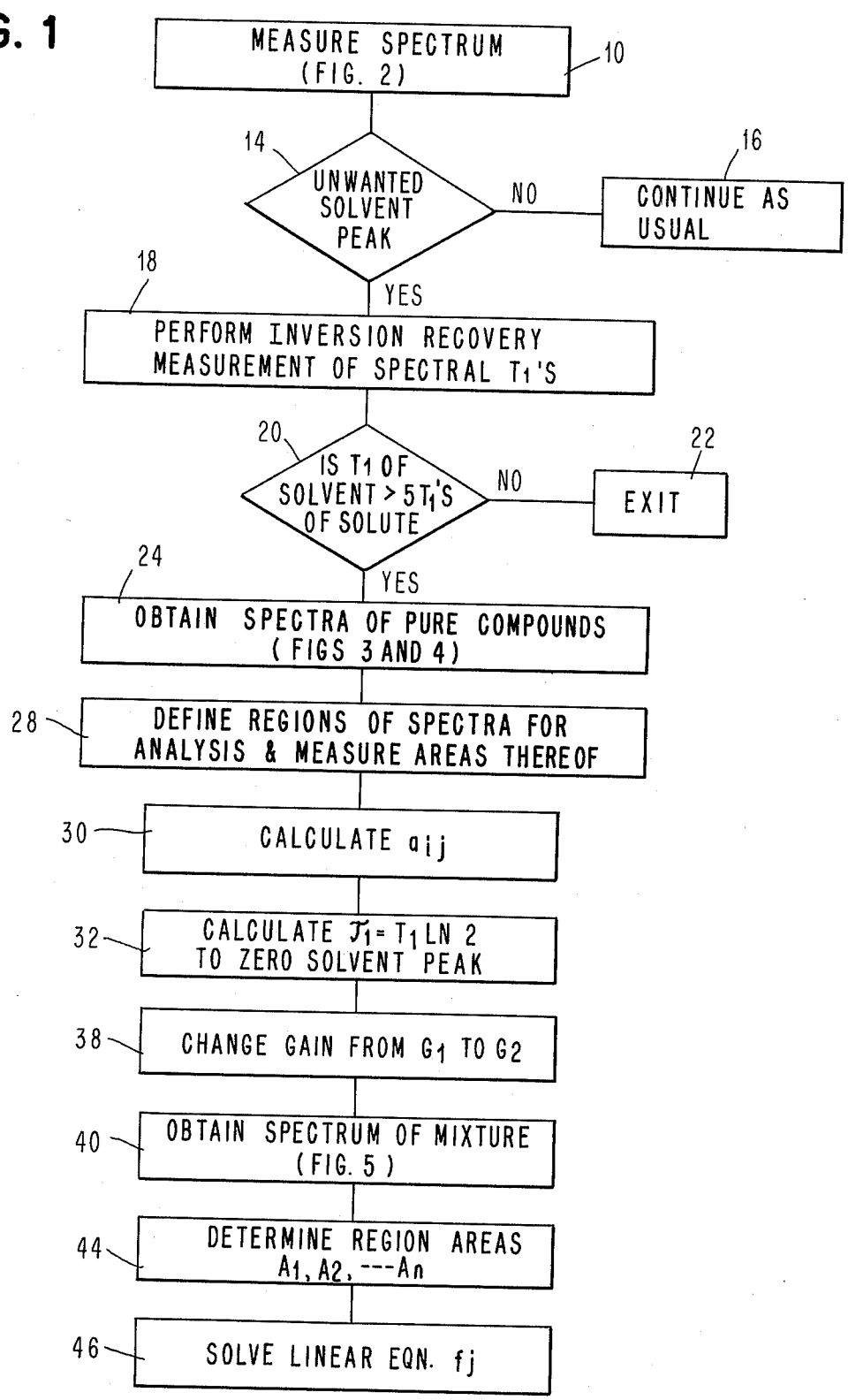
FIG. 1 is a flow chart of the method of the preferred embodiment of the invention.
Figure 2:
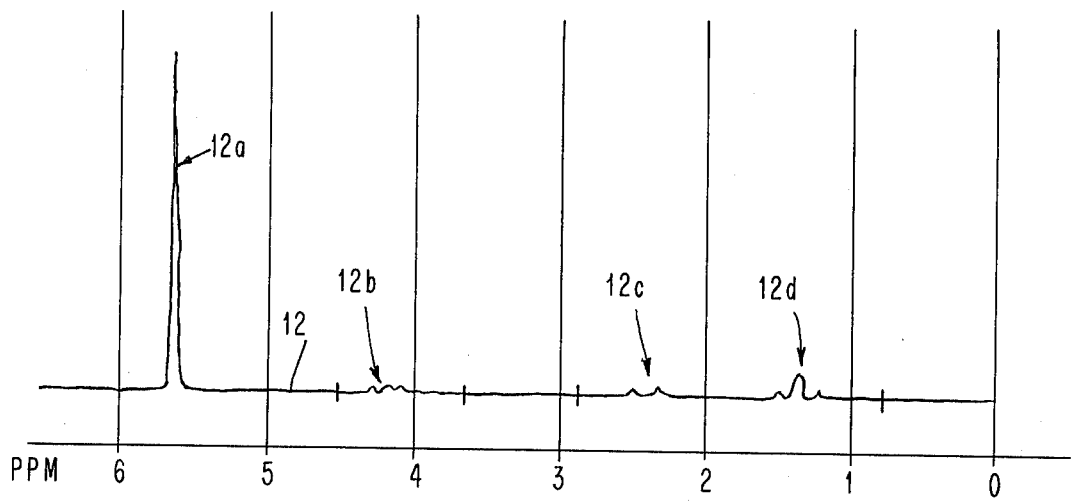
FIG. 2 is an NMR spectrum of an exemplary solution of a type that can be analyzed by the method of the invention.

Referring now to FIG. 1, in accordance with the first step 10 of the invention, a spectrum is produced, such as spectrum 12 in FIG. 2. Such a spectrum is a normal one produced by the application of a 90° pulse followed by the free induction decay (FID) signal that through the Fourier transform (FT) and phase correction results in the spectrum such as shown in FIG. 2. The spectrum is produced in accordance with the normal operation of the spectrometer following whatever instructions or procedures are necessary. Thus, in accordance with the operation of the aforementioned model WH 90, the spectrum is produced by preparing the solution and placing it in the prescribed container in the spectrometer. The spectrometer is adjusted to frequency lock on the deuterium resonance of the solvent and to set the gain of the lock receiver to the appropriate level. The magnetic field is swept to lock the sample onto resonance and then a button is pressed to lock the field to the resonant frequency of the solvent. The desired frequency offset is entered into switches on the console and the receiver gain is adjusted to provide a signal from the sample to cover the dynamic range. In this step, the particular spectrometer model has an oscilloscope which can be used to adjust the gain to provide a maximum height for one of the spectral peaks which height does not exceed the dynamic range. Thereafter, the spectrometer can be operated to produce the spectrum while a manual phase correction is performed using the oscilloscope, so that all the peaks are above the base line. At this point a hard copy of the spectrum may be recorded on the instrument plotter to produce the spectrum such as shown in FIG. 2.

In accordance with the specific example described hereinafter used to illustrate the invention spectrum 12 was produced from a solution of 2 $\frac{1}{2}$% by weight of diethyl suberate (DES) and 2 $\frac{1}{2}$% diethyltetradecanedioate (DETDD) in a solvent composed of 75% chloroform (CHCL$_3$) and 25% deuterochloroform (CDCL$_3$). Such a solvent is a common one used in spectrometry where the deuterochloroform is used for the lock purpose. It will be observed that spectrum 12 includes a dominant peak 12A due to the solvent and three peak regions 12B, 12C and 12D due to the other compounds of the solution. Peaks 12B and 12C are barely perceptible and 12D indicates some activity in that region. Each of these spectrum represent the chemical shift in terms of parts per million (PPM) relative to TMS (tetramethyl silane). Peak 12A dominates the spectrum where the remaining regions 12B, 12C and 12D do not have much of a dynamic range. To those skilled in the art of spectroscopy, this spectrum then suggests that the materials might be subject to the inversion recovery technique described hereinafter.

Referring again to FIG. 1, step 14 involves an examination of the spectrum resulting from step 10 and deciding whether or not the spectrum contains an unwanted solvent peak. If it does not, then the spectroscopist would proceed as usual to step 16. There are generally two types of unwanted peaks, one illustrated with reference to spectrum 12 wherein the solvent peak dominates the system or is otherwise so out of proportion to the peaks of the solute that an accurate analysis cannot be made of the solute. The other type of unwanted peak is where the solvent peak overlaps or interferes with the solute peak or one of the solute peaks in that both have nearly the same degree of checmical shift so that an accurate determination cannot be made. Thus, as a result of step 14, the spectroscopist concludes that there is an unwanted solvent peak, then steps 18 and 20 perform the task of deciding whether or not the solution is capable of undergoing the further analysis of the invention.

To make such a determination, step 18 involves measuring the spin relaxation times $T_1$ of the various spectral components through inversion recovery techniques. Such measurements are conventional and well described in the literature. See for example, "Pulse and Fourier Transform NMR", by Farrar and Becker, published by Academic Press, 1971, beginning at page 20. Once these measurements are made, then step 20 compares the results and a determination is made as to whether or not the spin relaxation time $T_1$ of the solvent is greater than five times that of the closest component of the solute. If it is not, the technique is not applied and an exit is made in step 22. If it is greater than 5 times, then we proceed to the calibration analysis described below. This factor of 5 times is merely preferable and is not critical. If the solvent and solute $T_1$ times are equal, the process will not work. If the relative times are somewhere between being equal and five, the solute will not be completely relaxed, for the purpose described hereinafter, and such fractional relaxation would have to be compensated for by knowing such fraction. At 5 times, there has been a nearly 100% relaxation of the solute so that the procedure can proceed without the necessity of knowing the fractional state of relaxation and the procedure is thus more greatly simplified.

Figure 3:
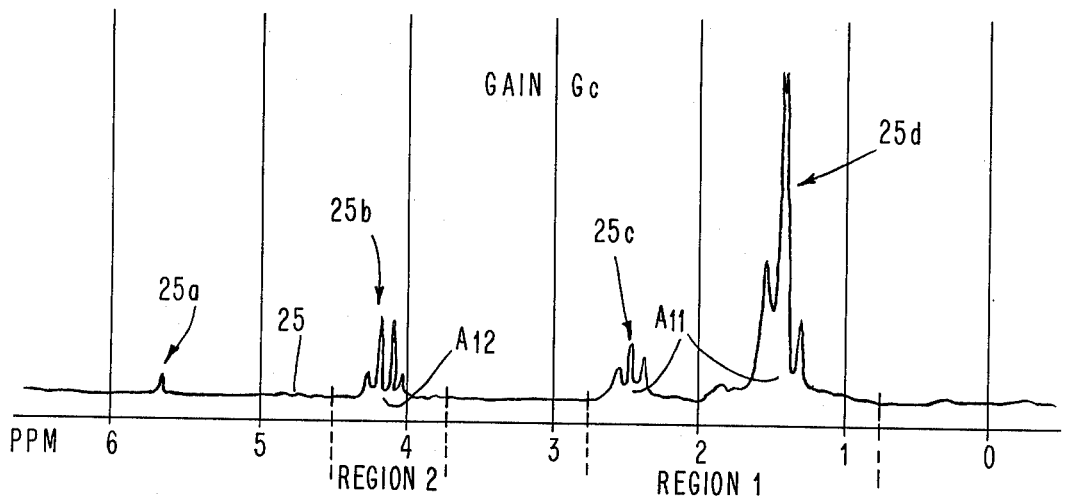
FIGS. 3 and 4 are two NMR spectra produced for the calibration step of the invention.

A calibration process is performed by obtaining spectra of pure compounds of the solute when dissolved in a solvent that does not produce a dominant peak reading. To accomplish this, in the exemplary method of the invention, spectrum 25 in FIG. 3 represents that due to a 5% weight solution of DETDD in $CDCL_3$. Spectrum 26 represents that due to a 5% by weight solution of DES in $CDCL_3$. Both spectrum were produced at the same phase correction and at the same gain setting on the spectrometer which gain setting was adjusted to produce a full dynamic range of the maximum peak in each spectrum, here corresponding to peaks 25D and 26D. In both instances, the solvent peaks 25A and 26A are relatively insignificant. Because of the chemical similarity between these two compounds, the resultant spectra are very similar and have peak regions B, C and D located at the approximately same chemical shift.

Figure 4:
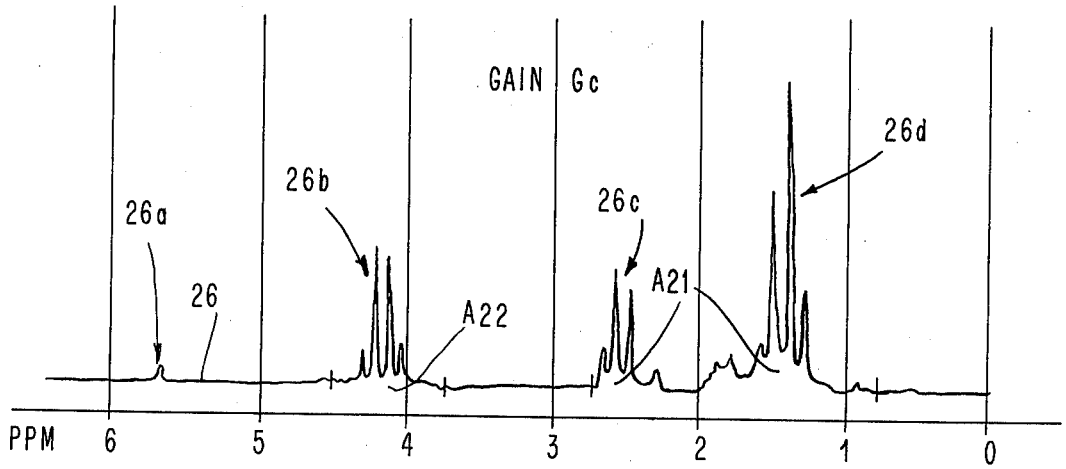

In continuing with the further analysis of the compounds, step 28 involves defining separate regions of the spectra for analysis, the regions generally having peaks therein to which more than one compound contributes. Each spectrum is divided into a number of regions which corresponds in number to the number of compounds making up the solute, so that, as will be obvious from the following description, they can be used to generate a number of simultaneous equations necessary to solve for the particular number of compounds. In the example, each spectrum is divided into two regions 1 and 2. Region 1 extends from 0.75 to 2.75 PPM and region 2 extends from 3.75 to 4.5 PPM. These same regions are used throughout the spectra of FIGS. 3-5. Then, the respective areas between the spectrum and the base line are measured within each region. This can be done physically using the hard copy of the spectrum or might be done by integrating the area through use of a computer where the spectrometer is coupled into the computer. These respective areas are, as shown in FIGS. 3 and 4, $A_{11}$, $A_{12}$, $A_{21}$, and $A_{22}$. The subscripts respectfully identify the compound number and region number. Compound 1 is DETDD and compound 2 is DES.

Thereafter, in step 30, the area per unit weight $a_{ij}$ is determined by dividing the measured areas obtained in step 28 by the weight expressed in grams per milliliter of the compound producing such area. The resultant figures then represent the areas produced by the respective compounds in the respective regions per unit weight of such compounds, at a given gain setting $G_c$ of the spectrometer. It will be recalled that both calibration spectra are produced at the same gain setting.

Next, step 32 involves determining or calculating the value of $\tau$ that is necessary to minimize the solvent peak when the final spectrum is produced. To better understand this aspect of the invention, reference is now made to FIG. 6 which shows two theoretical graphs of the magnetization vector as they are used to calculate the relaxation times $T_1$ previously discussed. Graph 34 is a series of points taken relative to the solute and graph 36 is a similar series of points measured for the solvent. The vertical axis is the magnetization vector and the horizontal axis is the period $\tau$ used in the pulsing sequence 180°-$\tau$-90° to produce FID signals. Such graphs are conventional and known in the art. See for example the aforementioned book "Pulse and Fourier Transform NMR." Each point on the curve or graph represents the initial height of the FID signal which is proportional to the magnitude of the magnetization vector M. In accordance with the conventional procedure, the spin system is normally thought of as extending along the Z axis of an orthogonal coordinate system and at equilibrium has a magnetization value $M_O$. The 180° pulse is operative to invert the magnetization along the Z axis. During the period $\tau$, the spin system relaxes longitudinally causing the magnetization to go from a value of $-M_O$ through zero towards the equilibrium value of $+M_O$. After the time $\tau$, the 90° pulse is applied along the X axis, as was the 180° pulse, causing M to rotate towards the Y axis. This produces a FID signal, the initial height of which is proportional to M. Each point of both graphs is this initial height. It should be noted that at the point where the graphs cross the zero axes, the subsequent 90° pulse is ineffective to induce any FID signal because the sample contains no Z component of magnetization.

Thus, in comparing the two graphs 34 and 36, use is made of the fact that the relaxation time of the solvent is more than five times greater than that of the solute whereby the slopes of the two curves differ. When the solvent graph 36 crosses the axis zero at $\tau_1$, it should be noted from graph 34 that at this $\tau_1$ the solute system is completely relaxed or at its equilibrium value. Thus, if the solution is pulsed through a sequence 180°-$\tau_1$-90°, then the 90° pulse would be theoretically ineffective to produce a FID signal from the solvent whereas it would produce one on the solute. This is known as the inversion recovery technique whereby, at least theoretically, the solvent peak can be eliminated. In the specific example being disclosed in connection with the method of the invention, $\tau_1$ for the solvent used initially to produce spectrum 12 was determined to be 3.5 seconds and this time will be used to produce the spectrum shown in FIG. 5.

Prior to producing such spectrum, step 34 involves changing the gain on the spectrometer from $G_c$ (calibration) to $G_a$ (analysis) to provide the full dynamic range associated with the instrument, if necessary. Otherwise, the same gain can be used. Then in step 40, a spectrum 42 is produced of the mixture to be analyzed, such mixture being the same as that used to produce spectrum 12. To produce spectrum 42, the spectrometer is operated with a 180°-$\tau_1$-90° pulse where $\tau_1$ is equal to the time previously described relative to FIG. 6 at which the solute compounds have completely relaxed while the solvent is only partially relaxed. The spectrometer gain is adjusted to give a maximum peak height for region 42D. Spectrum 42 includes a peak 42A corresponding to the solvent peak, and peaks 42B, C and D which are each contributed by the compounds making up the solute. While theoretically the use of $\tau_1$ would eliminate any solvent peak, it actually does not eliminate it but minimizes it due to the fact that not all the forces acting upon the atoms are completely uniform. The distortion of peak 42A below the base line is due to principally RF field inhomogeneity. It is to be noted that the gain setting for producing the spectrum of FIG. 5 is about twenty times that used to produce the spectrum of FIG. 2 so that the height of peak 42A is in reality roughly 1/20th of the heigth of peak 12A if they were to be plotted to the same scale of gain settings.

Next in step 44, the same areas under spectrum 42 within regions 1 and 2 are measured or calculated. Thereafter, in step 46, the following linear equations are solved by entering the appropriate values from step 44, from step 30 and from the respective gain settings used during the calibration and during the analysis:

$$A_i \frac{G_c}{G_A} = a_{11}f_1 + a_{11}f_2 \qquad (6)$$

$$A_2 \frac{G_c}{G_A} = a_{21}f_1 + a_{22}f_2 \qquad (7)$$

wherein, relative to the specific example,
$A_1$ and $A_2$ are the respective areas under the peaks in regions 1 and 2 of spectrum 42
$G_c$ and $G_A$ are the respective gain settings of the spectrometer during steps 24 and 40
$a_{11}$, $a_{12}$, $a_{21}$ and $a_{22}$ are the results from step 30 and $f_1$ and $f_2$ are the concentrations of compounds 1 and 2.
The more general solutions for N compounds is:

$$A_i \frac{G_c}{G_A} = \sum_{j=1}^{N} a_{ij}f_j \qquad (8)$$

While the above example illustrates one application of the method of the invention, its extension to solutes containing more than two compounds should be obvious to persons skilled in the art. Its application to a solution wherein the solvent peak interferes with one of the solute peaks should also be appreciated. For example, in the analysis for milk for lactose, the lactose peaks are close to the water peak so as to be affected by the water peak. Since the lactose relaxation time is about 10 times faster than that of water, the use of the inversion recovery technique described herein permits an accurate analysis to be made for the lactose. The ability to increase the gain while the solvent peaks is suppressed produces a greater dynamic range utilization and greater accuracy in the analysis and operation of the equipment.

While only one detailed embodiment of the invention has been described herein, it should be apparent that changes can be made in the details and arrangements of steps without departing from the spirit and scope of the invention as defined in the appended claims.

What is claimed is:
1. The method of quantitatively analyzing a mixture of two or more compounds through use of a pulsed FT NMR spectrometer having an adjustable variable gain, comprising the steps of:
forming a solution by dissolving said mixture in a solvent having a relaxation time substantially longer then the longest relaxation of any one of said compounds;
placing said solution in said spectrometer and pulsing said soluion with a 180°-τ-90° pulse sequence where τ is equal to the time at which said mixture is at equilibrium while said solvent is only partially relaxed so as to minimize any free induction decay signal from said solvent following said 90° pulse, to generate a spectrum wherein any spectral peak of said mixture is unobstructed by any spectral peak of said solvent, said pulse sequence being applied at a given gain $G_A$ of said spectrometer;
dividing said spectrum into a number N of regions which number is at least as great as the number of compounds in said mixture and measuring the area $A_i$ under each region $i$ of said spectrum where $i$ varies from 1 to N;
and solving a series of simultaneous equations of the form

$$A_i \frac{G_c}{G_A} = \sum_{j=1}^{N} a_{ij}f_j$$

where
$a_{ij}$ is the area of spectral region $i$ produced by a known concentration of compound $j$ due to a gain $G_c$ on said spectrometer,
and $f_j$ is the concentration of compound $j$ to be found by solving said equations.
2. The method of claim 1 comprising:
determining $a_{ij}$ by operating said spectrometer at gain $G_c$ to form spectra from solutions of each pure compound $j$ dissolved in a solvent which does not contribute to the spectra, dividing each said spectra into a number of regions corresponding to those of said first mentioned spectrum, measuring the areas in each region of said spectra, and dividing such areas by the weight concentration of pure compounds $j$ to obtain $a_{ij}$.
3. The method of claim 1 wherein said gains $G_c$ and $G_A$ are each maximized to produce a spectrum using the full dynamic range of said spectrometer.
4. The method of quantitatively analyzing the concentrations of compounds in a mixture through use of a pulsed FT NMR spectrometer having an adjustable gain, comprising the steps of:
preparing a series of separate solutions each with a known concentration of a pure compound and using a solvent that will produce a spectral peak free from interfering with any peak due to the compounds dissolved thereby;
operating said spectrometer to generate a series of spectra, one for each pure compound, at a gain $G_c$;
dividing each spectra into the same number of regions which number is as great as the number of compounds in said mixture;
determining in each region the area per unit concentration of each compound;
preparing a solution of said mixture in a solvent having a relaxation time at least 5 times longer than the longest relaxation time of any one of said compounds;
operating said spectrometer at a gain $G_A$ by using an inversion recovery pulse sequence so that said solution of said mixture is pulsed at a point in time where said solute is at equilibrium while said solvent is only partially recovered from being inverted, to produce a mixture spectrum;
dividing said spectrum into regions corresponding to said regions of said spectra and measuring the areas of said mixture spectrum in each region;
and determining the respective concentrations of each compound of said mixture by determining how much each compound contributed to the respective areas in each mixture region using said area per unit concentration and equating the different gains $G_A$ and $G_c$.

5. The method of claim 4 wherein the last-mentioned steps comprises solving a series of simultaneous equations of the form $$A_i \frac{G_c}{G_A} = \sum_{i=1}^{N} a_{ij} f_j$$

where
- $a_{ij}$ equals the area per unit concentration
- $A_i$ is the area under the mixture spectrum in region $i$
- N is the numer of compounds in the mixture and
- $F_j$ is the concentration of compound $j$ to be determined.

* * * * *